United States Patent

Jun

[11] Patent Number: 5,915,191
[45] Date of Patent: Jun. 22, 1999

[54] METHOD FOR FABRICATING A SEMICONDUCTOR DEVICE WITH IMPROVED DEVICE INTEGRATION AND FIELD-REGION INSULATION

[75] Inventor: Young Kwon Jun, Seoul, Rep. of Korea

[73] Assignee: LG Semicon Co., Ltd., Choongchungbook-Do, Rep. of Korea

[21] Appl. No.: 08/794,061

[22] Filed: Feb. 4, 1997

Related U.S. Application Data

[63] Continuation of application No. 08/423,688, Apr. 18, 1995, abandoned.

[30] Foreign Application Priority Data

Nov. 3, 1994 [KR] Rep. of Korea ..................... 94/28789

[51] Int. Cl.⁶ .................................................. H01L 21/76
[52] U.S. Cl. ........................ 438/431; 438/425; 438/430; 438/431; 438/447
[58] Field of Search .............................. 437/67, 69, 70; 438/425, 427, 430, 431, 439, 444, 447

[56] References Cited

U.S. PATENT DOCUMENTS

| | | | |
|---|---|---|---|
| 4,505,025 | 3/1985 | Kurosawa et al. | 437/67 |
| 4,651,406 | 3/1987 | Shimizu et al. | 438/275 |
| 4,892,614 | 1/1990 | Chapman et al. | 437/67 |
| 4,980,311 | 12/1990 | Namose | 437/67 |
| 5,130,268 | 7/1992 | Liou et al. | 437/67 |
| 5,472,904 | 12/1995 | Figura et al. | 437/67 |

FOREIGN PATENT DOCUMENTS

| | | | |
|---|---|---|---|
| 0038831 | 2/1985 | Japan | 437/67 |
| 0093642 | 5/1986 | Japan | 437/67 |
| 0168241 | 7/1986 | Japan | 437/67 |
| 0034556 | 2/1991 | Japan | 437/67 |

OTHER PUBLICATIONS

Wolf, "Silicon Processing For the VLSE Era" vol. 2; Process Integration; Lattice Press; pp. 20–27; 1990.

Primary Examiner—Trung Dang
Attorney, Agent, or Firm—Finnegan, Henderson, Farabow, Garrett & Dunner, L.L.P.

[57] ABSTRACT

A method for the fabrication of a semiconductor device is characterized by a series of steps comprising successively forming a trench in a field region of monosilicon substrate and forming an oxidation-preventive layer and a silicon layer in the trench, and oxidizing the silicon layer into a field oxide film to produce a channel stop region beneath the trench in the substrate. The method alternatively comprises forming a trench having a small pattern in a field region of a monosilicon substrate, sequentially forming an oxidation-preventive layer and a silicon layer on the surface of the trench, and oxidizing the silicon layer and the substrate of a field region having a large pattern size, at the same time, to produce a field oxide film and channel stop diffusion regions below both the trench and the field oxide film having a large pattern. Such channel stop diffusion regions contribute to minimizing the redistribution of channel stop ions in the monosilicon substrate below both the trench and the field oxide film having a large pattern. In addition, the channel stop diffusion region restrains stress caused by oxidation of the monosilicon substrate and improves the insulation properties of the field region.

5 Claims, 4 Drawing Sheets

METHOD FOR FABRICATING A SEMICONDUCTOR DEVICE WITH IMPROVED DEVICE INTEGRATION AND FIELD-REGION INSULATION

This application is a continuation, of application Ser. No. 08/423,688, filed Apr. 18, 1995, now abandoned.

BACKGROUND OF THE INVENTION

1. Field of the Invention

The present invention relates, in general, to a method for fabricating a semiconductor device and, more particularly, to a method for forming field regions in a semiconductor device, capable of minimizing redistribution of channel stop ions in a monosilicon substrate as well as restraining stresses in the monosilicon substrate, thereby improving insulation characteristics of the field regions in transistors and the like.

2. Description of the Prior Art

A local silicon oxidation process (hereinafter referred to as "LOCOS") has been used extensively to insulate active regions of silicon substrate from each other. In the LOCOS process, a field oxide film is formed in a field region of a silicon substrate.

To implement the LOCOS process, a pad oxide film is first formed entirely over a monosilicon substrate, followed by formation of a nitride film over a portion of the pad oxide film which is disposed over an active region of the monosilicon substrate. Then, the monosilicon substrate is subjected to thermal treatment in an oxidative atmosphere, to form a field oxide film selectively on a field region of the monosilicon substrate with the nitride film serving as a mask.

In an integrated circuit fabricated with use of the LOCOS process, a field transistor is formed between active regions of an n⁺ diffusion layer formed on a p type monosilicon substrate, that is, an N-field transistor is parasitically generated.

More specifically, in implementing the LOCOS process, a pad oxide film and a nitride film are successively formed entirely over a p type monosilicon substrate, and all of the nitride film except one area on the pad oxide film of an n⁺ diffusion layer of the monosilicon substrate is removed. The remaining nitride film is used as a mask as boron ions, p type impurities, are implanted into a field region of the monosilicon substrate, to use them as channel stop doping ions. Thereafter, a self-align doping process is performed under an oxidative atmosphere, i.e., the monosilicon substrate is selectively subjected to thermal treatment to form a field oxide film on the field region of the monosilicon substrate. A parasitical N-field transistor is thus formed with active regions of the n⁺ diffusion layer and an ion-implanted channel stop region disposed between these active regions.

However, during formation of the field oxide film, a segregation phenomenon is generated such that the boron ions implanted into the monosilicon substrate move to the interior of the field oxide film. This segregation phenomenon, after completion of the formation of the field oxide film, causes the density of boron ions to be reduced at the interface between the filed oxide film and the monosilicon substrate. The reduction in the density of the boron ions results in lowering the threshold voltage of the parasitical field transistor.

Generally, in an integrated circuit fabricated with the LOCOS process, a bird's beak phenomenon is generated at a boundary between the field region and the active region, reducing a substantial area of the active region through its encroachment upon the active region.

In addition, while the field oxide film is formed, lateral diffusion of the channel stop ions occurs to reduce the effective area of the active regions, giving rise to increasing junction capacitance with the diffusion layer of the active regions as well as junction leakage current. Therefore, the LOCOS process creates difficulty in raising the degree of integration of a semiconductor device.

Further, the thickness of the field oxide film is dependent upon a pattern size of an isolation region. Thus, although a field oxide film covering the isolation region having a small pattern size and another field oxide film covering the isolation region having a large pattern size are formed under the same oxidative condition, the former becomes thicker than the latter. The difference between their thicknesses is apparently caused by stress focused into an edge portion of the pattern of the isolation region.

When executing through-field ion implantation, boron ions for channel stop implanted through the thin field oxide film are present in the monosilicon substrate more deeply than those implanted through the thick field oxide film. Accordingly, it is difficult to complement the density of channel stop ions in the interface between the field oxide film and the silicon substrate, which causes a semiconductor device to exhibit instability of the insulation property.

To effectively correspond with high integration of semiconductor device, there are suggested new methods for improving insulation property of a field region with small pattern size.

A trench isolation method is one of these new methods wherein a trench is formed in a field region of a monosilicon substrate to increase the effective length of a channel with the aim of improving an insulation property of an isolation region. The trench isolation method comprises subjecting the field region of the monosilicon substrate to anisotropic dry etch, to form a trench in the field region, filling a polysilicon layer in the trench, and oxidizing the polysilicon layer. This method further comprises depositing an insulation layer on the surface of the trench in advance of the filling step.

In order to provides a better understanding of the background of the present invention, the trench isolation method and its problems will be described in greater detail.

Referring to FIGS. 1A through 1D, a conventional, prior art trench isolation method is illustrated.

As shown in FIG. 1A, a monosilicon substrate 1 has trenches 2 with different pattern sizes. For this, a first oxide film (not shown) is first formed entirely over the monosilicon substrate 1 and a typical photo etch process is carried out in such a way that the first oxide film is left over active regions, but removed over field regions with different pattern sizes, so as to expose areas of the monosilicon substrate 1 of the field regions. With the oxide film left in the active regions used as a mask, the monosilicon substrate 1 is subjected to an anisotropic dry etch to take off the monosilicon substrate in a predetermined thickness. As a result, trenches 2 having different pattern sizes but the same depth are formed in field regions of the monosilicon substrate 1. Thereafter, the first oxide film is eliminated.

As shown in FIG. 1B, a pad oxide film 3 and a nitride film 4 are successively deposited entirely over the monosilicon substrate 1 by chemical vapor deposition processes. The nitride film 4 deposited over the field regions is next removed by usual photo etching. As a result, the nitride film 4 is left only over the active regions of the monosilicon substrate 1.

Subsequently, a second oxide film 5 is deposited over the resulting structure with a thickness sufficient to fill the trench 2 having a small pattern size. The surface of the second oxide film 5 over the trench 2 having a small pattern is flat, whereas the surface of the second oxide film 5 over the trench having a large pattern is recessed. Next, using usual photo-technology, a first photosensitive film 6 is patterned only on the recessed surface of the second oxide film 5 which is present above the trench 2 having a large pattern size.

As shown in FIG. 1C, the second oxide film 5 is subjected to etch back, with the first photosensitive film 6 functioning as a mask, until the surface of the nitride film 4 is exposed. As a result, the trench 2 having a small pattern size is filled by the second oxide film 5, whereas the trench 2 having a large pattern size is, in part, filled by the second oxide film 5. After completion of the etch back, the first photosensitive film 6 is eliminated.

As shown in FIG. 1D, a third oxide film 7 is deposited over the resulting structure by a chemical vapor deposition process the moment the empty space between remaining segments of the second oxide film 5 in the trench 2 having a large pattern size causes the surface of the third oxide film 7 to have a cusp 8. A second photosensitive film 9 is coated on the third oxide film 7 with the aim of planarizing the cusp 8 of the third oxide film 7.

As shown in FIG. 1E, the second photosensitive film 9 and the third oxide film 7 are subjected to etch back at the same time, to take off the second photosensitive film 9 completely and the third oxide film 7 partially, followed by removal of the nitride film 4 left above the active regions. Until the surface of the monosilicon substrate 1 is exposed, the pad oxide film 3 is etched along with a part of the first and second oxide films 5, 7. As a result, the active regions and the field regions of the monosilicon substrate 1 become substantially flat.

However, the conventional trench isolation method has a problem that the oxide film filling the trenches by chemical vapor deposition process is inferior to a thermal oxide film with respect to insulation properties. In addition, the conventional trench method is also problematic in that, as the channel stop ions are redistributed between the monosilicon substrate and the field region, depletion of the channel stop ions occurs, deleteriously affecting the insulation property of the field transistor. Hence, the field regions with a small pattern size become poor in insulation property.

Furthermore, the conventional trench insulation method has other disadvantages including lattice damage of the monosilicon substrate resulting from the formation of the trenches, redistribution of channel stop ions resulting from the oxidation of the polysilicon layer, and heterogenous filling of the trench due to the different pattern sizes in the isolation regions.

SUMMARY OF THE INVENTION

It is, therefore, an object of the present invention is to overcome the above problems encountered in the prior art and to provide a method for fabricating a semiconductor device that is capable of preventing impurities from being redistributed below a trench in a monosilicon substrate and restraining stress of the monosilicon substrate through sequential formation of an oxidation-preventive layer and a nitride film on the surface of the trench in the monosilicon substrate, thereby improving the insulation property of a field region.

Based on intensive research and study leading to the present invention, the above object is accomplished by a method for fabricating a semiconductor device, comprising the steps of: forming one or more trenches with one or more different pattern sizes in field regions of a semiconductor substrate: forming an ion-implanted layer beneath each of the trenches in the semiconductor substrate: forming an oxidation-preventive layer entirely over the semiconductor substrate: forming a silicon layer only on an area of the oxidation-preventive layer within the trenches: and subjecting the silicon layer and the ion-implanted layer to thermal treatment, to oxidize the silicon layer and to form a channel stop diffusion region.

According to another aspect of the invention, a semiconductor device includes one or more trenches having a depth and one or more different pattern sizes in field regions of a semiconductor substrate, each trench having side walls and a bottom; an oxidation-preventive layer over the side walls and bottom of the trench; a silicon layer over an area of the oxidation-preventive layer within the trenches; and a channel stop diffusion region below the bottom of the trench.

According to yet another aspect of the invention, a semiconductor device includes a trench in a first field region of a semiconductor substrate; an oxidation-preventive layer over the inner surface of the trench; a silicon layer over the oxidation-preventive layer within the trench; and a channel stop diffusion region below the trench and a second field region of the semiconductor substrate.

Additional features, advantages, and objectives of the invention will be set forth in the description which follows and in part will be apparent from the description, or may be learned by practice of the invention. The objectives and advantages of the present invention will be realized and attained by the apparatus particularly pointed out in the following written description and the appended claims, as well as in the accompanying drawings.

It will be understood that both the foregoing general description and the following detailed description are exemplary and explanatory and are intended to provide further explanation of the invention as claimed.

The accompanying drawings are intended to provide a further understanding of the invention and are incorporated in and constitute a part of the specification, illustrate a preferred embodiment of the invention and, together with the description, serve to explain the principles of the invention.

DETAILED DESCRIPTION OF THE PREFERRED EMBODIMENTS

Figure 1A:
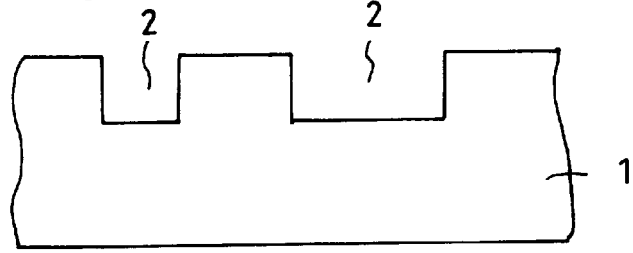
FIGS. 1A through 1E are schematic cross sectional views illustrating a conventional trench insulation method.
Figure 1B:
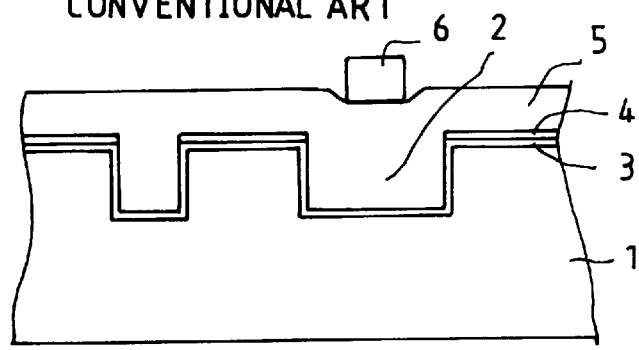
Figure 1C:
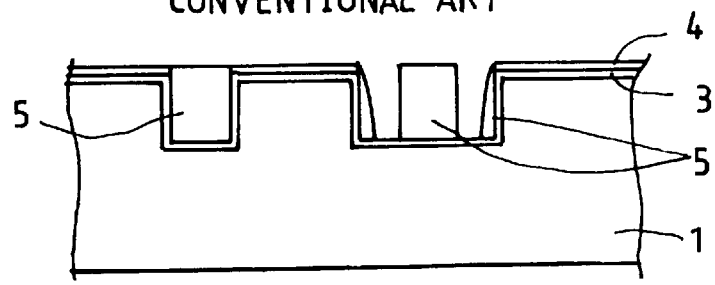
Figure 1D:
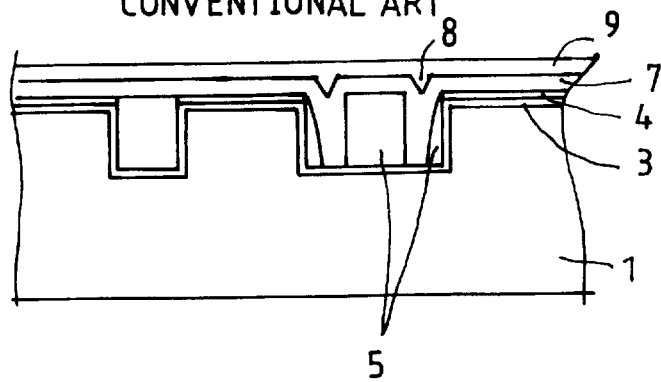
Figure 1E:
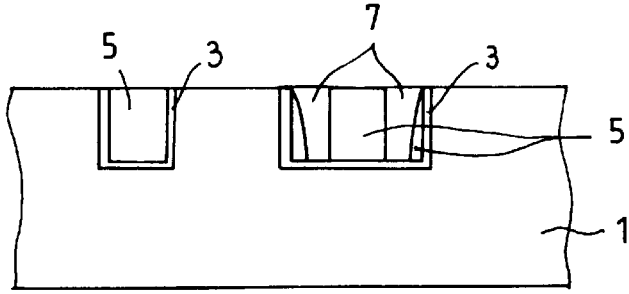

The invention in preferred embodiments is best understood with reference to the accompanying drawings, wherein like reference numerals are used for like and corresponding parts, respectively.

With reference to FIGS. 2A through 2E, a method is illustrated for fabricating a semiconductor device, according to a first embodiment of the present invention.

Figure 2A:
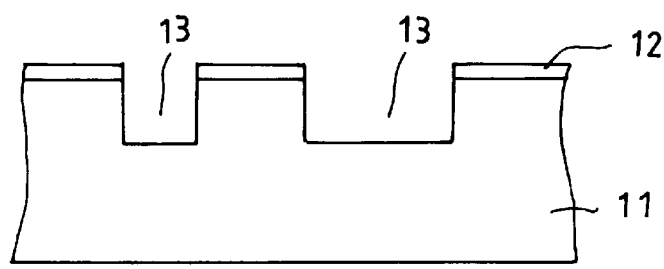
FIGS. 2A through 2F are schematic cross sectional views illustrating a method for the fabrication of semiconductor device, according to an embodiment of the present invention.

First, an insulation film such as a first oxide film 12 is formed with a thickness such as about 1,000 to 5,000 Å over a monosilicon substrate 11. Next, trenches 13 are formed with different pattern sizes in the monosilicon substrate 11, as shown in FIG. 2A.

To form the trenches 13, a photo etch process is initially applied to the first oxide film 12 so as to remove that portion formed over field regions of the monosilicon substrate 11. The portion formed over active regions of the monosilicon substrate 11 is retained. A chemical dry etch process, preferably using a gas mixture of $CNF_3$ and $O_2$, or an anisotropic dry etch process, using a $Cl_2$ or $SF_6$ gas, is then applied to the exposed areas of monosilicon substrate 11 of the field regions, to remove the monosilicon substrate 11, to a depth such as about 3,000 to 5,000 Å, with the remaining first oxide film 12 serving as a mask. As a result, trenches 13 with different pattern sizes are formed.

Figure 2B:
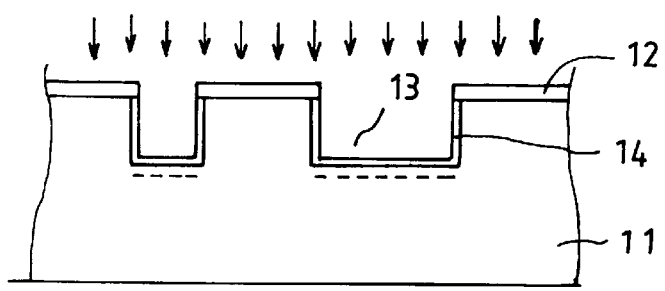

Next, a second oxide film 14 is grown with a thickness such as about 100 to 350 Å on the surfaces of the trenches 13. An ion-implanted layer is then formed beneath the second oxide film 14 of the trench 13 in the monosilicon substrate 11, as shown in FIG. 2B. The growth of the second oxide film 14 is accomplished by subjecting the monosilicon substrate 11 to thermal treatment at a temperature such as about 800 to 950° C. in an oxidative atmosphere, such as $pyro(H_2+O_2)$ and steam, with the first oxide film 12 serving as a mask. For the ion-implanted layer, channel stop ions against N-field region, such as B and $BF_2$, are implanted, as indicated by arrows, into the monosilicon substrate 11 at an acceleration voltage such as about 30 to 80 KeV and at a dose such as about 2 to 5 E13/cm$^2$.

Figure 2C:
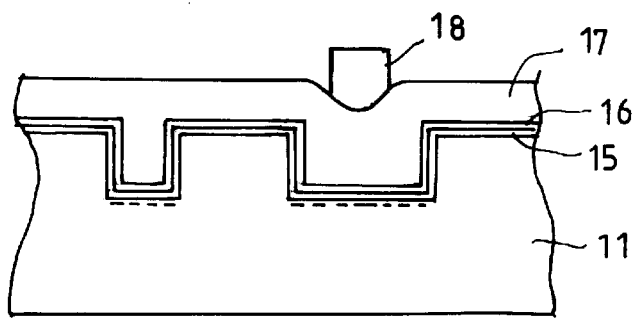

Once the first oxide film 12 and the second oxide film 14 are completely eliminated, a pad oxide film 15 with a thickness of about 100 to about 350 Å, a nitride film 16 with a thickness such as about 1,400 Å and a blanket of silicon 17 are sequentially formed over the monosilicon substrate 11, as shown in FIG. 2C. The nitride film 16 functions as an oxidation-preventive layer in the operation of the semiconductor device, and is formed entirely over the pad oxide film 15 at a temperature such as about 750 to 850° C. by a low pressure chemical vapor deposition (hereinafter referred to as "LPCVD") process.

The blanket of silicon 17 is deposited with amorphous silicon or polysilicon at a temperature such as about 550 to 650° C. An LPCVD deposits the silicon blanket 17 in such a way that its thickness is sufficient to completely fill the trench having a small pattern, that is, larger than half of the width of this small trench.

As a result, the surface of the silicon layer 17 above the trench 13 having a large pattern size is recessed, whereas that of the silicon layer 17 above the trench 13 having a small pattern size is substantially flat. A photosensitive film 18 is then formed only on the recessed surface of the silicon layer 17 by a conventional photo etch process, as shown in FIG. 2C.

Figure 2D:
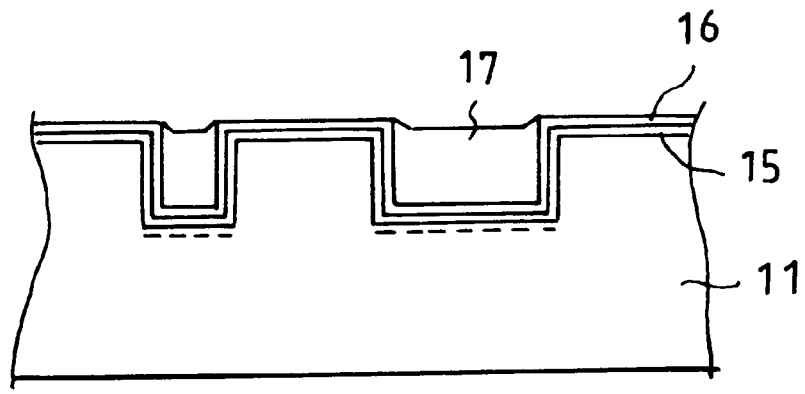

FIG. 2D is a cross section of the semiconductor device after the photosensitive film 18 is used as a mask while the silicon layer 17 is etched for planarization and, thereafter, is removed. For the planarization of the silicon layer 17, a chemical dry etch using a mixture gas of $CHF_3$ and $O_2$ or an anisotropic dry etch using a $Cl_2$ or $SF_6$ gas is executed until the nitride film 16 is exposed with the photosensitive film 18 functioning as a mask. If the photosensitive film 18 is formed at an incorrect position somewhat distant from a desired position on the silicon layer 17 above the trench 13 having a relatively large pattern size, the chemical dry etch using a mixture gas of $CHF_3$ and $O_2$ or the anisotropic dry etch using a $Cl_2$ or $SF_6$ gas fails to make the silicon layer 17 above the trench 13 flat, but instead produces a stringer of the silicon layer 17 collaterally. In this case, a further chemical etch process using a mixture gas of $CHF_3$ and $O_2$ or an isotropic etch process is needed to eliminate the stringer, thereby planarizing the silicon layer 17.

Figure 2E:
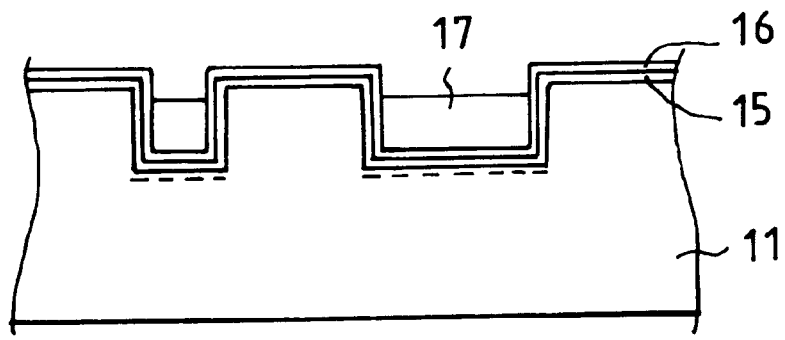

Subsequently, the planarized silicon layer 17 is subjected to etch back by a chemical etch process using a mixture gas of $CHF_3$ and $O_2$, so as to recess the silicon layer 17 within the trenches 13, as shown in FIG. 2E.

Figure 2F:
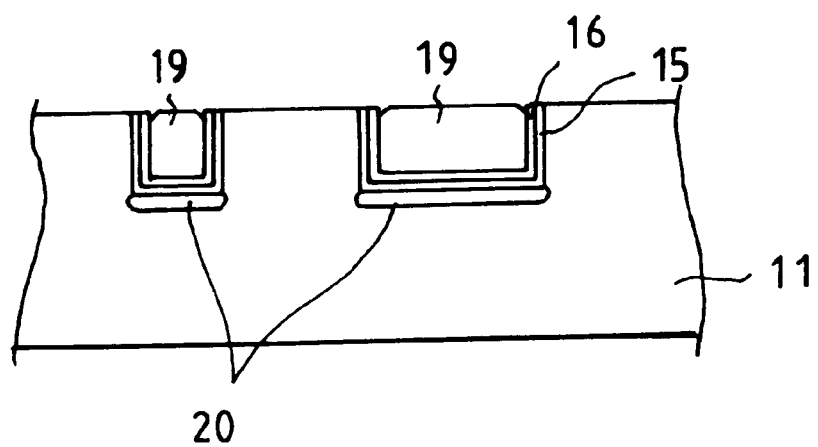

Thermal oxidation is carried out under an oxidative atmosphere, such as $pyro(H_2+O_2)$ or steam, to change the recessed silicon layer 17 into an oxide layer 19, activating the implanted ions to produce channel stop diffusion regions 20, as shown in FIG. 2F. When the recessed silicon layer 17 is thermally oxidized, it is swelled to a degree that the surface of the resulting oxide layer 19 is as high as the surface of the monosilicon substrate 11 of the active regions. Consequently, the resulting structure is totally flat. Thereafter, the nitride film 16 over the active regions is eliminated with a phosphoric acid solution or by an anisotropic etch process using a $CF_4$ or $SF_6$ gas, followed by removal of the pad oxide film 15 over the active regions, so as to complete the field regions.

Referring now to FIGS. 3A through 3E, a method for fabricating a semiconductor device is illustrated in accordance with a second embodiment of the present invention.

Figure 3A:
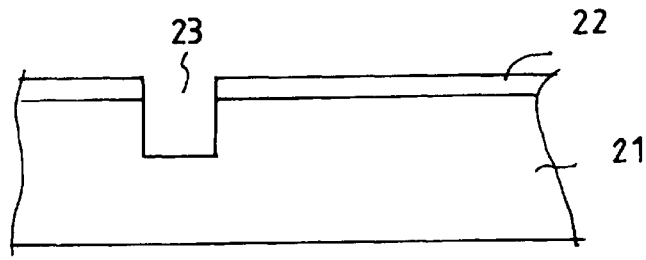
FIGS. 3A through 3E are schematic cross sectional views illustrating a method for the fabrication of semiconductor device, according to another embodiment of the present invention.

First, an insulation film such as a first oxide film 22 is formed over a monosilicon substrate 21 with a thickness such as about 1,000 to 5,000 Å. Trench 23 having a small pattern size is next formed in the monosilicon substrate 21, as shown in FIG. 3A.

To form the trench 23, a photo etch process is initially applied to the first oxide film 12, to remove it over a field region of the monosilicon substrate having relatively small pattern size and, thus, to expose an area of monosilicon substrate over the field region having a relatively small pattern size. Then, a chemical dry etch process using a gas mixture of $CHF_3$ and $O_2$ or an anisotropic dry etch process using a $Cl_2$ or $SF_6$ gas is applied to remove the exposed area of the monosilicon substrate 11 to a thickness such as about 3,000 to 5,000 Å with the remaining first oxide film 22 serving as a mask. As a result a trench 23 is formed with a relatively small pattern size.

Figure 3B:
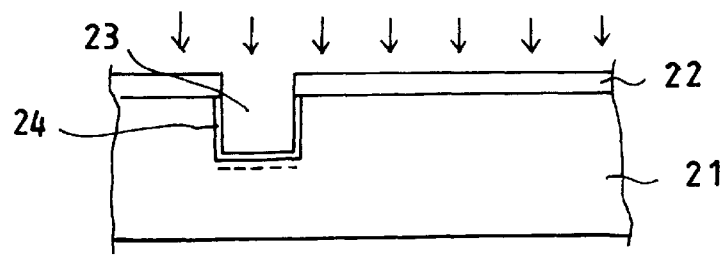

Next, a second oxide film 24 is grown on the surface of the trench 23 having the relatively small pattern size to a thickness such as about 100 to 350 Å. A first ion-implanted layer is then formed beneath the second oxide film 24 in the monosilicon substrate 21, as shown in FIG. 3B.

The growth of the second oxide film 24 is accomplished by subjecting the monosilicon substrate 21 to thermal treatment at a temperature such as about 800 to 950° C. in an oxidative atmosphere, such as $pyro(H_2+O_2)$ and steam, with the first oxide film 22 serving as a mask. For the first ion-implanted layer, channel stop ions, such as B and $BF_2$, are implanted against an N-field region, as indicated by arrows, into the monosilicon substrate 21 at an acceleration voltage of about 30 to about 80 KeV and at a dose of about 2 to about 5 E13/cm$^2$.

Figure 3C:
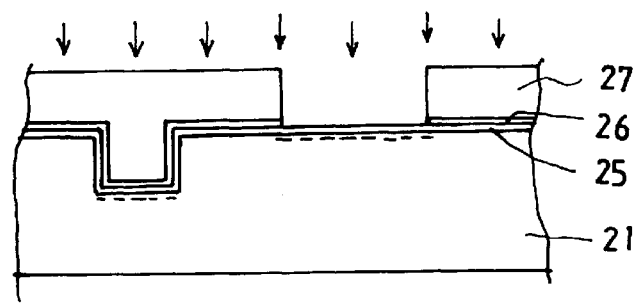

After completely removing the first oxide film 22 and the second oxide film 24, a pad oxide film 25, with a thickness such as about 100 to 350 Å, and a nitride film 26, with a thickness such as about 1,400 Å, are sequentially formed over the monosilicon substrate 21, as shown in FIG. 3C. The nitride film 16 functions in the operation of the semiconductor device as an oxidation-preventive layer and is formed over the entire pad oxide film 15 at a temperature such as about 750 to 850° C. by an LPCVD process.

Thereafter, a photosensitive film 27 is coated on the entire nitride film 26, followed by selective removal of the photosensitive film 27 to expose an area of the nitride film 26 over the field region having relatively a large pattern size. Then, with the remaining photosensitive film 27 used as a mask, the exposed area of the nitride film 26 is etched to expose an area of the pad oxide film 25. Channel stop ions, such as B and $BF_2$, are implanted against an N-field region, as indicated by arrows, into the monosilicon substrate 21 at an acceleration voltage of about 30 to about 80 KeV and at a dose of about 2 to about 5 $E13/cm^2$, to form a second ion-implanted layer beneath the pad oxide film 25 in the field region of monosilicon substrate having a relatively large pattern size, as shown in FIG. 3C. The photosensitive film 27 also serves as a mask for the ion implantation.

Figure 3D:
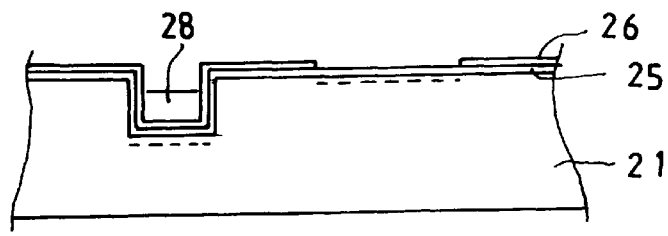

FIG. 3D is a cross section of the semiconductor device after the photosensitive film 27 is removed and the silicon layer 28 is formed in the trench 23 with a small pattern size. For the formation of the silicon layer 28, a blanket of silicon is first deposited with amorphous silicon or polysilicon at a temperature such as about 550 to 650° C. by an LPCVD such that its thickness is sufficient to completely fill the trench having a small pattern, that is, larger than half of the width of the small trench. The blanket of silicon is then subjected to etch back, to eliminate all the silicon except one area deposited within the trench of small pattern. As a result, the silicon layer 28 is recessed.

Figure 3E:
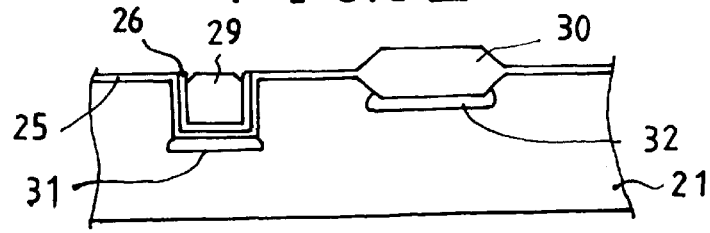

Thermal oxidation is carried out under an oxidative atmosphere, such as $pyro(H_2+O_2)$ or steam, to change the recessed silicon layer 28 and the pad oxide film 25 of the field region having a large pattern side into an oxide layer 29 and a field oxide film 30, respectively, activating the implanted ions to produce channel stop diffusion regions 31, 32, as shown in FIG. 3E. When the recessed silicon layer 28 is thermally oxidized, it is swelled to a degree that the surface of the resulting oxide layer 29 is as high as the surface of the monosilicon substrate 11 of the active regions. Thereafter, the nitride film 26 over the active regions is removed with a phosphoric acid solution or by an anisotropic etch process using a $CF_4$ or $SF_6$ gas, so as to complete the field regions.

As described hereinbefore, the present invention is characterized by a series of steps consisting of forming a trench in a field region of monosilicon substrate, successively forming an oxidation-preventive layer and a silicon layer in the trench, and oxidizing the silicon layer into a field oxide film to produce a channel stop region beneath the trench in the substrate. Alternatively, the steps consist of forming a trench in a field region with a small pattern of a monosilicon substrate, sequentially forming an oxidation-preventive layer and a silicon layer on the surface of the trench, and oxidizing the silicon layer and the substrate of a field region having a large pattern size, at the same time, to produce a field oxide film and channel stop diffusion regions below both the trench and the field oxide film having a large pattern. Such channel stop diffusion regions play a role in minimizing the redistribution of channel stop ions in the monosilicon substrate below both the trench and the field oxide film having a large pattern. In addition, the channel stop diffusion region of the present invention restrains stress caused by oxidation of the monosilicon substrate. Consequently, the method according to the present invention improves the insulation property of field region.

Other features, advantages and embodiments of the invention disclosed herein will be readily apparent to those exercising ordinary skill after reading the foregoing disclosure. In this regard, while specific embodiments of the invention have been described in detail, variations and modifications of these embodiments can be effected without departing from the spirit and scope of the invention as described and claimed.

What is claimed is:

1. A method for fabricating a semiconductor device, comprising the steps of:

forming a trench in a first field region of a semiconductor substrate with an ion-implanted layer in the semiconductor substrate underlying a bottom of said trench;

forming an oxide film on surface of said trench;

forming a first ion-implanted layer beneath said trench by implanting an impurity;

removing said oxide film;

forming an insulation film on said semiconductor substrate including said trench;

forming an oxidation-preventive layer on said insulation film;

forming a mask layer on said oxidation-preventive layer;

removing a portion of said mask layer and said oxidation-preventive layer over a second field region of said semiconductor substrate;

forming a second ion-implanted layer in said second field region;

removing said mask layer;

forming a silicon layer on said semiconductor substrate to fill said trench after removing said mask layer, said silicon layer having a recessed portion above said trench; and simultaneously oxidizing said silicon layer recessed portion in said trench and said second field region by a LOCOS method, whereby to form isolation regions in the first and second field regions.

2. A method in accordance with claim 1, wherein a width of the isolation region in the first field region is smaller than the width of the isolation region in the second field region.

3. A method in accordance with claim 1, wherein the oxidation-preventive layer includes a nitride layer.

4. A method in accordance with claim 1, wherein the silicon layer includes a polysilicon.

5. A method in accordance with claim 1, wherein the silicon layer includes an amorphous silicon.

* * * * *